United States Patent [19]
Johnson et al.

[11] Patent Number: 5,101,117
[45] Date of Patent: Mar. 31, 1992

[54] VARIABLE DELAY LINE PHASE-LOCKED LOOP CIRCUIT SYNCHRONIZATION SYSTEM

[75] Inventors: Mark G. Johnson, Sunnyvale; Edwin L. Hudson, Santa Clara, both of Calif.

[73] Assignee: MIPS Computer Systems, Sunnyvale, Calif.

[21] Appl. No.: 659,526

[22] Filed: Feb. 22, 1991

Related U.S. Application Data

[63] Continuation of Ser. No. 496,050, Mar. 16, 1990, abandoned, which is a continuation of Ser. No. 156,779, Feb. 17, 1988, abandoned.

[51] Int. Cl.$^5$ .......................... H03K 5/13; H03K 5/00
[52] U.S. Cl. .................................. 307/269; 307/262; 328/55; 328/63; 328/72; 328/155
[58] Field of Search ............... 307/269, 262, 606, 594, 307/597, 480; 328/55, 63, 72, 155, 133; 377/47, 78, 79, 52

[56] References Cited

U.S. PATENT DOCUMENTS

| | | | |
|---|---|---|---|
| 2,883,536 | 4/1959 | Salisbury et al. | 328/155 |
| 3,206,686 | 9/1965 | Goor | 328/55 |
| 3,763,317 | 10/1973 | Coleman, Jr. et al. | 328/155 |
| 3,883,810 | 5/1975 | Tacussel | 328/55 |
| 4,255,793 | 3/1981 | Nakamura | 328/63 |
| 4,309,649 | 1/1982 | Naito | 307/510 |
| 4,380,083 | 4/1983 | Andersson et al. | 307/480 |
| 4,461,014 | 7/1984 | Fujino | 328/155 |
| 4,495,468 | 1/1985 | Richards et al. | 328/55 |
| 4,506,227 | 3/1985 | Heinen et al. | 328/155 |
| 4,637,018 | 1/1987 | Flora et al. | 328/55 |
| 4,644,184 | 2/1987 | Miyawaki et al. | 307/269 |
| 4,766,602 | 8/1988 | Wilkinson et al. | 328/72 |
| 4,831,338 | 5/1989 | Yamaguchi | 331/1 A |

FOREIGN PATENT DOCUMENTS

| | | |
|---|---|---|
| 5969786 | 12/1986 | Australia . |
| 0010077 | 4/1980 | European Pat. Off. . |
| 0278534 | 1/1988 | European Pat. Off. ............ 328/155 |
| 2127594 | 4/1984 | United Kingdom . |

OTHER PUBLICATIONS

Johnson, Mark G. et al. "A Variable Delay Line Phase Locked Loop for CPU–Coprocessor Synchronization," *IEEE International Solid State Circuits Conference*, V. 31, Feb. 1988, pp. 142-143.

Blum, "Automatic Adjustment of Several Decentrally Generated Clock Pulse Sequences of a Computer Distributed Over Several USCI Chips", IBM Tech. Bulletin, vol. 24, No. 2, Jul. 1981, pp. 895-897.

M. Bazes, "A Novel Precision MOS Synchronous Delay Line," *IEEE Journal of Solid-State Circuits* (Dec. 1985), SC-20(6):1265-1271.

M. Forsyth et al., "A 32-Bit VLSI CPU with 15-MIPS Peak Performance," *IEEE Journal of Solid-State Circuits* (Oct. 1987), SC-22(5):768-775.

*Primary Examiner*—Timothy P. Callahan
*Attorney, Agent, or Firm*—Townsend and Townsend

[57] ABSTRACT

A system for synchronizing the operation of a CPU and coprocessor operating from a common clock signal includes a first voltage controlled delay line connected to receive the clock signal and delay it by a fixed time interval before supplying it to one of the CPU or coprocessor. A second voltage controlled delay line is connected to receive the clock signal and delay it by an adjustable time interval before supplying it to the other of the CPU or coprocessor. The time interval of the second delay line is determined by the potential of a control signal generated from a phase locked loop circuit coupled to the output terminals of the CPU and coprocessor.

16 Claims, 4 Drawing Sheets

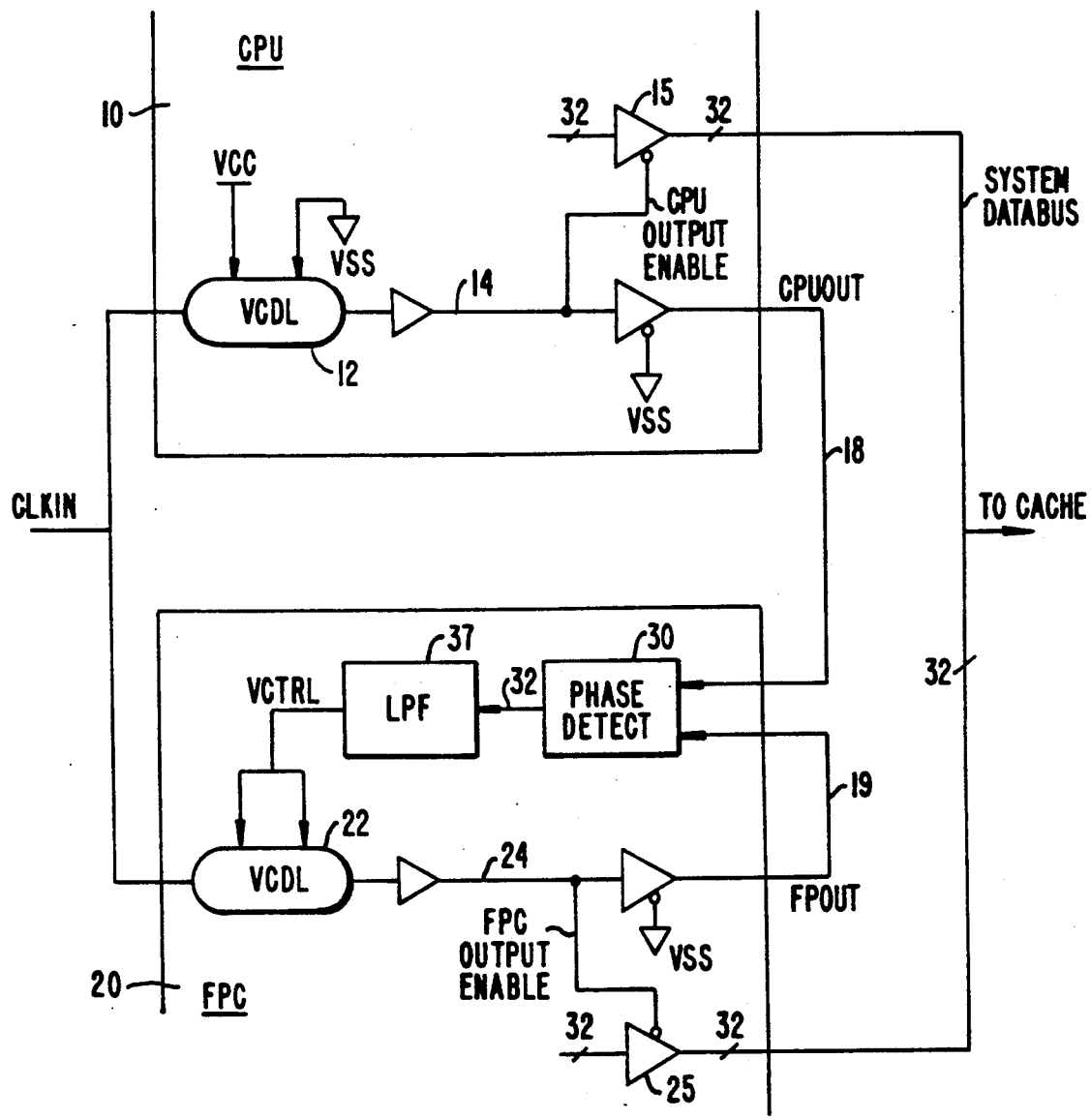
FIG._1.

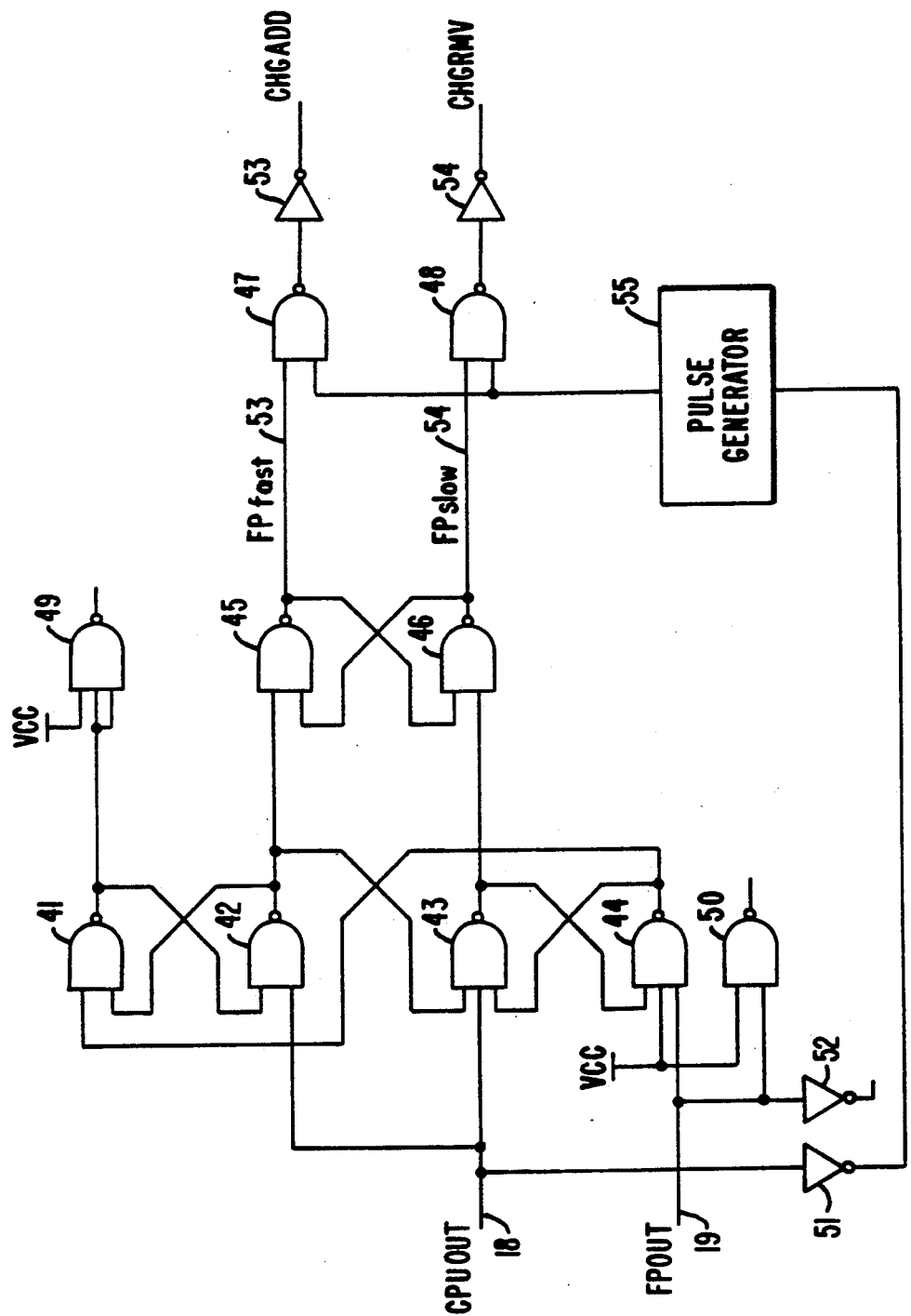
FIG._2.

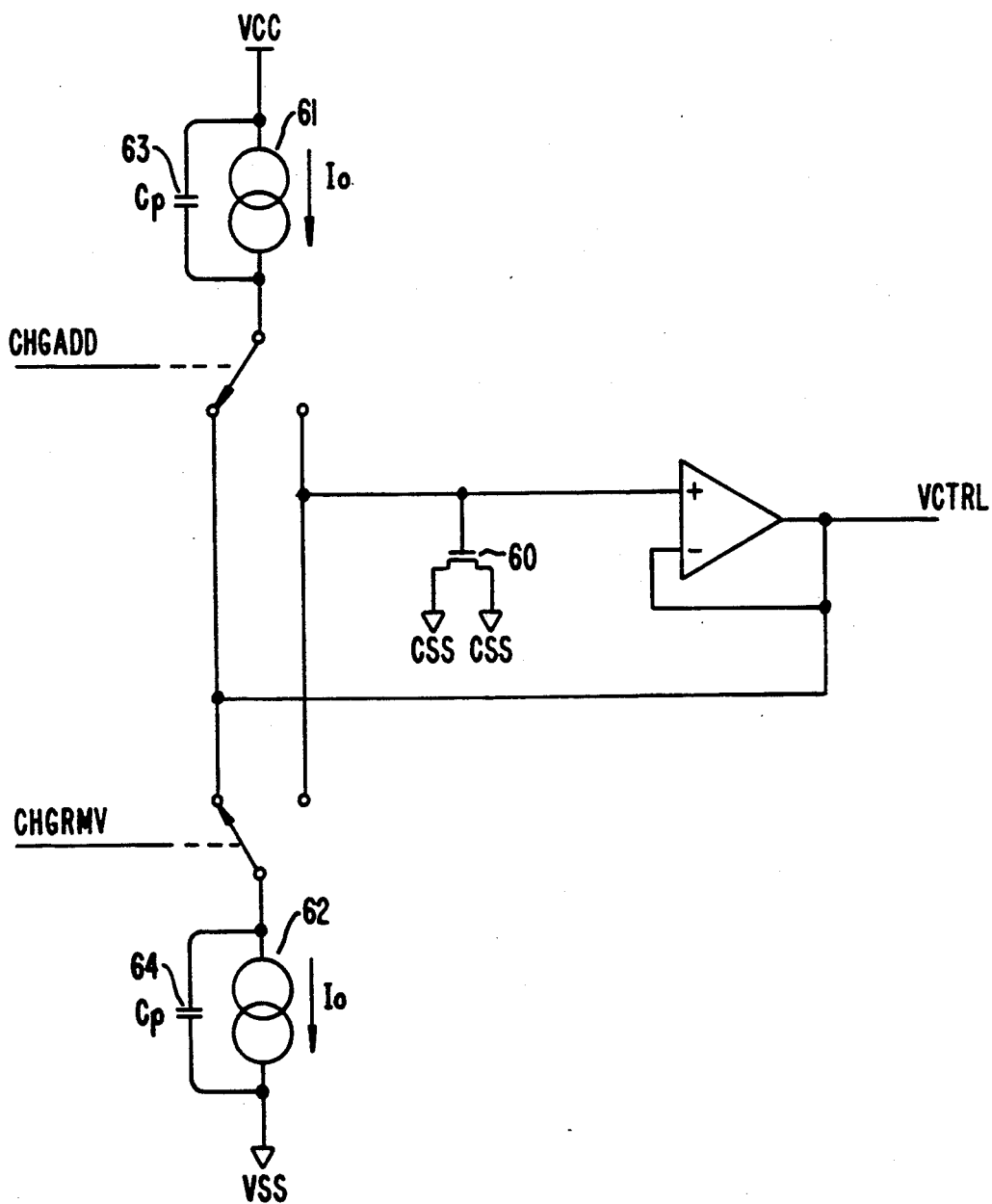
FIG._3.

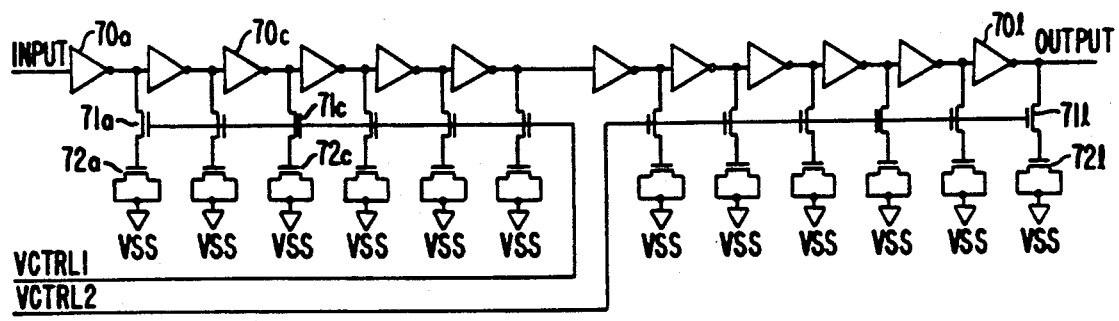
FIG._4.
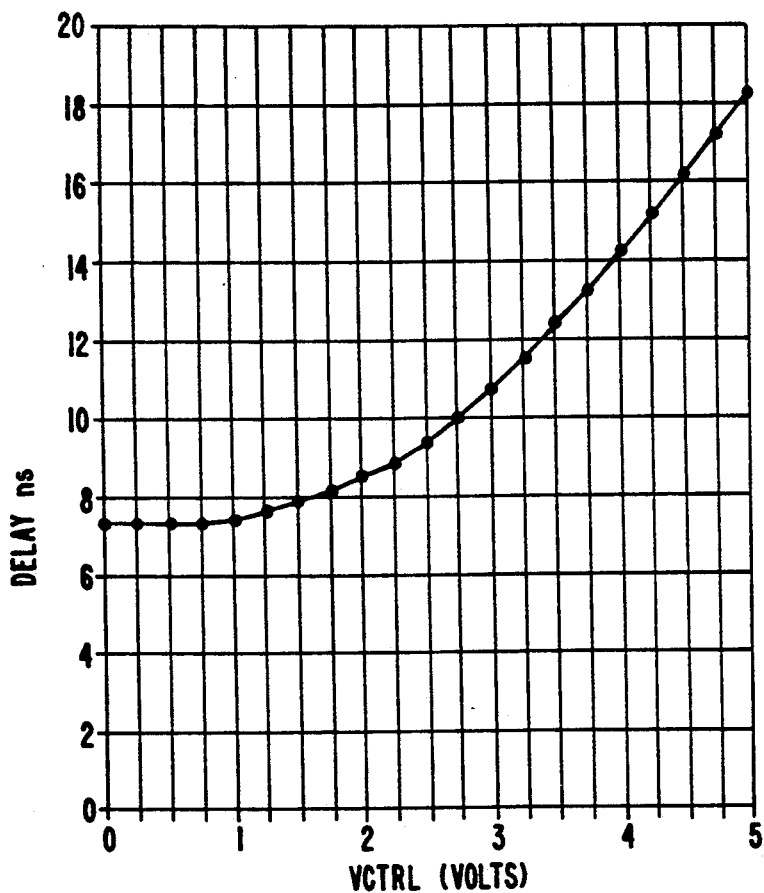
FIG._5.

VARIABLE DELAY LINE PHASE-LOCKED LOOP CIRCUIT SYNCHRONIZATION SYSTEM

This is a continuation of application Ser. No. 07/496,050, filed Mar. 16, 1990, now abandoned, which is a continuation of application Ser. No. 156,779, filed Feb. 17, 1988, now abandoned.

BACKGROUND OF THE INVENTION

1. Field of the Invention

This invention relates to systems for synchronizing the operation of electronic circuits, and in particular to a voltage controlled variable delay line phase-locked loop system for synchronizing the operation of a central processing unit and a floating point coprocessor.

b. 2. Description of the Prior Art

The synchronization of several circuits operating in a system is a problem faced by many system designers. For example, in high performance microprocessor-based systems, it is desirable to synchronize the operation of the various individual integrated circuits within the system to minimize dead time on the system bus, as well as prevent undesired data collisions. In automatic test systems, to assure validity for the input and output signals from the device being tested, all of the input pins of the device must be driven essentially simultaneously, while the condition of the output pins is monitored.

One solution to synchronizing microprocessor-based systems, not necessarily in the prior art, is described in "A 32-Bit VLSI CPU with 15-MIPS Peak Performance" by M. Forsyth, et al., *IEEE Journal of Solid-State Circuits* (Oct. 1987) SC-22(5):768-775. The system described in that paper employs a global master clock to which all integrated circuit operations are synchronized.

One well known technique for synchronizing the operation of the circuits is to employ a phase-locked loop circuit. The phase-locked loop circuit typically employs a phase detector to compare an input signal with a reference signal from a voltage-controlled oscillator. The output of the phase detector thus is proportional to the difference in phase between the input signal and the signal from the voltage-controlled oscillator. The output of the phase detector, representing the error between the signals, then is supplied through a low pass filter to control the voltage-controlled oscillator. The error signal causes the voltage-controlled oscillator to lock to the incoming signal, despite an initial tuning which might not correspond to the input signal.

SUMMARY OF THE INVENTION

We have developed a variable delay line phase-locked loop technique which is particularly advantageous for synchronizing the operation of a central processing unit with a coprocessor, or with other chips in a microprocessor-based system. Our synchronization technique minimizes dead time on the system bus, and allows correction for variability in microprocessor operating speed resulting from variations in the manufacture of the microprocessors.

In a preferred embodiment our system for synchronizing a first and a second circuit operating from a common clock signal includes a first delay line connected to receive the common clock signal and delay it by a selected interval before supplying the clock signal to the first circuit, a second delay line connected to receive the clock signal and delay it by an adjustable interval in response to a control signal before supplying it to the second circuit, and a phase detection circuit connected to both of the first and second circuits for detecting when each supplies an output signal and in response supplying the control signal to the second delay line, the control signal having a potential related to the difference between the output signals. In the preferred embodiment the phase detector consists of an edge-triggered flip-flop circuit having an output which is passed through a low pass filter before driving a voltage-controlled delay line.

BRIEF DESCRIPTION OF THE DRAWINGS

FIG. 1 is a block diagram showing the system of the invention.

FIG. 2 is a block diagram of the phase detector of FIG. 1.

FIG. 3 is a block diagram of the low pass filter of FIG. 1.

FIG. 4 is a block diagram of the voltage-controlled delay line of FIG. 1.

FIG. 5 is a graph illustrating the operation of the delay line of FIG. 4.

DETAILED DESCRIPTION OF THE PREFERRED EMBODIMENTS

FIG. 1 is a block diagram of a preferred embodiment of the invention as applied to synchronize the operation of a central processing unit 10 with a floating point coprocessor 20. Each of the CPU 10 and FPC 20 is connected to receive a clock signal CLKIN from an external clock source. In the CPU chip 10, the clock signal is supplied to a voltage-controlled delay line 12 where it is delayed by a fixed time interval having a duration which is described below. After being delayed, the clock signal is supplied on line 14 to the remainder of the chip, including where it is employed as a CPU output enable signal in conjunction with driver 15. In the preferred embodiment for a 32-bit wide bus, the output enable signal controls 31 other drivers in the manner of driver 15. The output enable signal permits the CPU to access the system data bus, and through that bus the cache memory (not shown).

To maximize the speed of operation of the entire system, it is important that the CPU chip 10 and the FPC chip 20 communicate with the cache at maximum speed, and therefore with minimal dead time on the system data bus. In a preferred embodiment the CPU chip 10 operates at greater than 10 million instructions per second, and therefore demands a very high bandwidth interface. In a preferred embodiment this bandwidth is achieved using a 16.7 megaHertz clock for the CPU and FPC by driving the cache interface pins twice per 60 nanosecond cycle, once for instructions and once for data. This pin multiplexing requires careful control of cache timing or else successive skew between the chips will narrow the data valid window, thereby violating setup and hold times and causing bus contention. The problem is made more severe because of differences in propagation delays in different chips as a result of variations in the manufacturing process. Variations in CMOS line width affect the switching speed of the chips, rendering the synchronization of the chips even more difficult.

The floating point coprocessor chip 20 also is connected to receive the clock signal CLKIN. The clock signal is immediately supplied to a voltage-controlled delay line 22, which unlike the delay line on the CPU, has a variable time delay. The output from the delay line is employed to enable the driver 25 to allow the FPC chip 20 access to the system data bus. In the same manner as with respect to the CPU for a 32-bit bus, there will be 32 drivers 25. The floating point chip also includes a phase detector 30 connected to receive the CPU output enable signal on line 18 and the FPC output enable signal on line 19. The phase detector supplies an output signal on line 32 indicative of the phase difference of the signals received on lines 18 and 19. When the CPU and FPC are properly synchronized, the signal on line 32 will indicate that the CPU output signal arrived first 50% of the time and that the FPC output signal arrived first 50% of the time. The output signal on line 32 is supplied to a low pass filter 37 which averages the output signal over time and supplies a control signal VCTRL to the variable voltage controlled delay line 22. Delay line 22 will lengthen or shorten the time delay of the clock signal passing through the delay line, thereby matching the FPC signal propagation delay to the CPU propagation delay, and synchronizing their operation.

In the foregoing description the phase detector, low pass filter, and variable voltage-controlled delay line have all been described as residing on the coprocessor chip. It should be appreciated, however, that these components could as easily be disposed on the CPU chip, with the fixed delay line being placed on the coprocessor chip, to achieve the same result. Either way the output enable lines enable the drivers 15 and 25 to place data on the bus or latch data from the bus.

In a conventional phase-locked loop system, the output of the phase detector is passed through a low pass filter to control a voltage-controlled oscillator. The voltage-controlled oscillator has a frequency output which is a function of voltage. Conventional phase-locked loop systems, however, are extremely sensitive to noise, and because such control systems have a pole, they are difficult to stabilize. In the system of our invention, the low pass filter is placed on chip to avoid noise between the internal ground and the external ground and prevent capacitive cross-talk between pins. The system is further advantageous as it allows the chips to be operated with slower or even interrupted clock signals to assist with debugging. When the chips are restarted, they will synchronize. With a conventional phase-locked loop system employing a voltage controlled oscillator which controls frequency, the clock signal cannot be slowed down or stopped entirely because if such occurs the oscillator is required to provide an instantaneous alteration in frequency with no error or settling time.

FIG. 2 is a more detailed schematic of the phase detector 30 shown in block form in FIG. 1. Phase detector 30 comprises an edge-triggered D-type flip-flop which, on the rising edge of signal CPUOUT samples signal FPOUT and places the result on output lines 53 and 54. If FPOUT goes high after CPUOUT goes high, then line 54, FPslow, will be low and line FPfast will be high. On the other hand, the opposite will be the case if the floating point chip 20 has already gone high at the time its output is sampled by the signal CPUOUT. The CPUOUT signal on line 18 also drives a pulse generator 55 which enables NAND gates 47 and 48 for a fixed time, preferably on the order of 10 nanoseconds. This translates the CPUOUT and FPOUT input signals into charge add and charge remove output signals which are supplied to the low pass filter. Gates 49, 50 and 52 balance the loads being driven by the cross-coupled pairs of gates, thereby maintaining symmetrical operation at the same speed.

FIG. 3 is a schematic of the low pass filter. The charge add and charge remove signals from the circuitry shown in FIG. 2 are used to control a pair of switches which ultimately cause a large capacitor 60 to be charged or discharged by a pair of matched current sources 61 and 62. By virtue of the fixed width pulse from pulse generator 55, a fixed-size charge packet is pumped into or out of the capacitor on each cycle, thereby making the size of the correction step independent of the clock frequency. When the charge add and charge remove signals are not active, the switches are connected as shown in FIG. 3 to short the parasitic capacitors 63 and 64 to the control voltage, thereby nulling charge-sharing errors.

The output signal from the circuit of FIG. 3, VCTRL is used to drive the voltage-controlled delay line. Thus, if the floating point chip is too fast, FPfast on line 53 is active, and therefore the charge add signal will also be active. During the time the pulse generator pulse is active, the charge add switch will be connected to capacitor 60 allowing charge to flow onto the capacitor 60. In a similar manner, if the FPC is slow, the charge remove line will be active, causing current source 64 to remove charge from the capacitor. During the time when neither the charge add nor the charge remove lines are active, the capacitor 60 floats. When the current source is not charging or discharging the filter capacitor, its output is shorted to node VCTRL, a low impedance version of the filter capacitor voltage. Any parasitic capacitance Cp is maintained at the filter capacitor voltage, so very little charge sharing occurs when the current source is connected to the filter capacitor. Thus, the combination of the phase detector and low pass filter provides a circuit which expresses a desired time delay as a function of voltage.

FIG. 4 is a schematic of the voltage-controlled delay line shown in block form in FIG. 1 as each of blocks 12 and 22. As shown in FIG. 4, the delay line consists of a series of 12 drivers 70a, 70b . . . 70l, 12 control transistors 71a, 71b . . . 71l, and 12 capacitors 72a, 72b . . . 72l. Each capacitor is connected to Vss. The theory of operation of the delay line is that each inverter 70c has an output impedance which will drive its load capacitor 72c. By varying the RC time constant, a longer delay is provided. In other words, by changing the resistive load on the output of each driver, more of the capacitive load may be made "visible" to the inverter. By employing the transistors 71, for a small gate-to-source voltage an open circuit is provided, and the transistor is essentially off. By the time the transistor gate reaches about 2 volts, it is turned on, coupling the capacitance directly to the output terminal.

The circuit shown in FIG. 4 is employed as the voltage-controlled delay line 12 in the CPU chip 10, as well as the delay line 22 in the floating point coprocessor chip 20. In the case of the CPU chip, the delay line is set at one-half its tuning range by connecting one of control lines VCTRL1 or VCTRL2 to Vcc and the other to Vss. Thus, half the inverters are effectively completely disconnected from the load capacitors, while the other six inverters are effectively connected directly to the capacitor. In contrast, in the floating point coprocessor 20 the control lines VCTRL1 and VCTRL2 are shorted together and connected to receive the VCTRL signal from the output terminal of FIG. 3. The voltage control delay line employs stages in pairs so that differences between rising and falling propagation delays are cancelled, thereby keeping the clock signal essentially symmetrical. Under minimum allowed supplied voltage and maximum temperature, the adjustment range is approximately 12 nanoseconds and the delay coefficient is about 3 nanoseconds per volt, as shown in FIG. 5. As shown there, the operation of the circuit is essentially linear for control voltages greater than 2 volts.

Once the circuitry shown in FIGS. 1-4 acquires phase lock, the fixed size correction step will exceed the phase error and the circuit will apply alternating corrections to maintain equilibrium. Therefore, to minimize phase jitter, the correction step size is chosen to be small. While this results in relatively long capture time, because the phase capture takes place only during a system reset, this slow capture is not disadvantageous. Furthermore, once phase lock is acquired, changes in the CPU or FPC propagation delays as a result of temperature or supply voltage changes are easily tracked and corrected.

Because the phase-locked loop system of our invention controls the time delay instead of frequency, an external system may be employed to alter the clock period during operation of the circuitry being synchronized. Conventional phase-locked loop systems employing voltage-controlled oscillators cannot track such events, and are subject to significant noise effects. In the case of our circuit, a hypothetical hundred millivolts of noise on VCTRL produces only 0.3 nanoseconds of output jitter. In contrast, the voltage-controlled oscillator will have a coefficient on the order of 12 megaHertz per volt, thereby producing much more output jitter for the same hypothetical noise.

In the preceding description of the preferred embodiment, various circuit implementation details have been provided to enable a complete understanding of the preferred embodiment of the invention. The scope of the invention is set forth in the appended claims.

We claim:

1. A system for synchronizing a first and a second circuit receiving a common clock signal, and in response to an active transition of said clock signal, said first circuit producing an active transition in a first output signal and said second circuit producing an active transition in a second output signal the synchronizing system comprising:

first delay means coupled to the first circuit and receiving the common clock signal for delaying the common clock signal by a selected interval before supplying the common clock signal to the first circuit;

second delay line means coupled to the second circuit and receiving the common clock signal for delaying the common clock signal by an adjustable interval in response to a control signal before supplying the common clock signal to the second circuit; and phase detection means coupled to said first and second circuits for detection of the active transition of said second output signal relative to said first output signal during a cycle of said common clock signal, said phase detection means generating a control signal in response to the respective detections of the active transitions in said first and second output signals, said control signal having a voltage potential determined by the relative detections of the active transitions of the first and second output signals, the phase detection means comprising an edge-triggered flip-flop circuit for detecting which of the active transitions of said first and second output signals occurred earlier and means for averaging the control signal over time before supplying the control signal to the second delay means.

2. A system as in claim 1 wherein the phase detection means further comprises means for changing the control signal by a fixed magnitude on each cycle, the change being in a first direction for an earlier detection of the first output signal active transition than that of the second output signal, the change being in a second direction for an earlier detection of the second output signal active transition than that of the first output signal.

3. The system as in claim 1 wherein: the selected interval of the first delay line is mid-range of a selected interval range.

4. A system as in claim 1 wherein the second delay line means comprises a voltage-controlled delay line for delaying the clock signal by a time related to the potential of the control signal.

5. A system as in claim 4 wherein the second voltage-controlled delay line includes at least one stage comprising:

an inverter having an input terminal connected to receive the clock signal and having an output terminal;

a resistor-capacitor network having a variable time constant, the network connected between the output terminal and a fixed potential; and control means connected to the network and connected to receive the control signal and in response vary the time constant.

6. The system as in claim 5 wherein the network comprises:

a capacitor having a first electrode connected to the fixed potential; and a transistor having a first electrode connected to the output terminal of the inverter, a second electrode to a second electrode of the capacitor, and a control electrode connected to receive the control signal.

7. A system as in claim 6 wherein the voltage-controlled delay line comprises a plurality of stages.

8. A system as in claim 7 wherein the delay line comprises an even number of stages.

9. A system as in claim 1 wherein the averaging means comprises:

a first current source switchably connected by a first switch between a storage capacitor and an upper potential source;

a second current source switchable connected by a second switch between the storage capacitor and a lower potential source; and switching means responsive to the control signal for controlling the first and second current sources.

10. A system as in claim 9 wherein the switching means comprises:

a pulse generator for supplying pulses;

a first gate connected to receive the pulses and the control signal and having a first output coupled to control the first switch; and a second gate connected to receive the pulses and a complementary control signal and having a second output coupled to the second switch.

11. A system as in claim 1 wherein the first circuit comprises a microprocessor and the second circuit comprises a coprocessor.

12. The system of claim 1 in which the averaging means comprises:
a first current source switchably connected by a first switch between a storage capacitor and an upper potential source,
a second current source switchably connected by a second switch between the storage capacitor and a lower power potential, and
switching means responsive to the control signal for controlling the first and second current sources,
the averaging means connected to receive the control signal and average the control signal over time before supplying the control signal to the second delay line means.

13. A system for synchronizing a first and a second circuit receiving a common clock signal, and in response to an active transition of said clock signal, said first circuit producing an active transition in a first output signal and said second circuit producing an active transition in a second output signal the synchronizing system comprising:
first delay means coupled to the first circuit and receiving the common clock signal for delaying the common clock signal by a selected interval before supplying the common clock signal to the first circuit;
second delay line means coupled to the second circuit and receiving the common clock signal for delaying the common clock signal by an adjustable interval in response to a control signal before supplying the common clock signal to the second circuit; and
phase detection means coupled to said first and second circuits for detection of the active transition of said second output signal relative to said first output signal during a cycle of said common clock signal, said phase detection means generating a control signal in response to the respective detections of the active transitions in said first and second output signals, the phase detection means comprising means for changing the control signal by a fixed magnitude on each cycle, the change being in a first direction for an earlier detection of the first output signal active transition than that of the second output signal, the change being in a second direction for an earlier detection of the second output signal active transition than that of the first output signal, the phase detection means further comprising means for averaging the control signal over time before supplying the control signal to the second delay means.

14. A system as in claim 13 wherein the means for detecting further comprises an edge-triggered flip-flop circuit for detecting which of the active transitions of said first and second output signals occurred earlier.

15. The system of claim 13 in which the averaging means comprises:
a first current source switchably connected by a first switch between a storage capacitor and an upper potential source,
a second current source switchably connected by a second switch between the storage capacitor and a lower power potential, and
switching means responsive to the control signal for controlling the first and second current sources,
the averaging means connected to receive the control signal and average the control signal over time before supplying the control signal to the second delay line means.

16. A system for synchronizing a first and a second circuit receiving a common clock signal, and in response to an active transition of said clock signal, said first circuit producing an active transition in a first output signal and said second circuit producing an active transition in a second output signal the synchronizing system comprising:
first delay means coupled to the first circuit and receiving the common clock signal for delaying the common clock signal by a selected interval before supplying the common clock signal to the first circuit;
second delay line means coupled to the second circuit and receiving the common clock signal for delaying the common clock signal by an adjustable interval in response to a control signal before supplying the common clock signal to the second circuit; and
phase detection means coupled to said first and second circuits for detection of the active transition of said second output signal relative to said first output signal said phase detection means generating a control signal in response to the respective detections of the active transitions in said first and second output signals, said control signal having a voltage potential determined by the relative detections of the active transitions of the first and second output signals, the phase detection means including averaging means, the averaging means comprising:
a first current source switchably connected by a first switch between a storage capacitor and an upper potential source,
a second current source switchable connected by a second switch between the storage capacitor and a lower potential source; and
switching means responsive to the control signal for controlling the first and second current sources,
the averaging means connected to receive the control signal and average the control signal over time before supplying the control signal to the second delay line means.

* * * * *